United States Patent
Lozhkin (10) Patent No.: US 9,571,138 B2
(45) Date of Patent: Feb. 14, 2017

(54) TRANSMISSION DEVICE AND NOISE REMOVAL METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/050,698

(22) Filed: Feb. 23, 2016

(65) Prior Publication Data
US 2016/0294420 A1 Oct. 6, 2016

(30) Foreign Application Priority Data
Apr. 2, 2015 (JP) .................. 2015-076112

(51) Int. Cl.
*H04B 1/04* (2006.01)

(52) U.S. Cl.
CPC ..... *H04B 1/0475* (2013.01); *H04B 2001/0408* (2013.01)

(58) Field of Classification Search
CPC .... H03M 3/418; H03M 3/412; H03M 7/3022; H03M 3/50
See application file for complete search history.

(56) References Cited

U.S. PATENT DOCUMENTS

| | | | | |
|---|---|---|---|---|
| 5,153,593 A | * | 10/1992 | Walden | H03M 3/354 341/143 |
| 7,230,996 B2 | | 6/2007 | Matsuura et al. | |
| 7,817,725 B2 | | 10/2010 | Matsuura et al. | |
| 2002/0071508 A1 | * | 6/2002 | Takada | H04B 1/71 375/346 |

(Continued)

FOREIGN PATENT DOCUMENTS

| | | |
|---|---|---|
| JP | 2004-072735 | 3/2004 |
| JP | 2005-045767 | 2/2005 |
| JP | 2005-295521 | 10/2005 |

OTHER PUBLICATIONS

Antoine Frappe et, al., An All-Digital RF Signal Generator Using High-Speed Sigma-Delta Modulators, IEEE Journal of Solid-State Circuits, vol. 44, No. 10, Oct. 2009. pp. 2722-2732 (11 pages).

(Continued)

*Primary Examiner* — Aristocratis Fotakis
(74) *Attorney, Agent, or Firm* — Fujitsu Patent Center (57) ABSTRACT

A base station device includes: a converting unit that converts a transmission signal with a multi-bit quantization bit rate to a signal with a quantization bit rate smaller than the quantization bit rate of the transmission signal; a first amplifier that amplifies the signal; an extracting unit that extracts a noise component generated in the signal due to the conversion; a second amplifier that amplifies the noise component; a combining unit that combines the signal amplified by the first amplifier with the noise component amplified by the second amplifier to remove a noise com- (Continued)

ponent included in the amplified signal; and an adding unit that adds, based on an error between the signal from which the noise component has been removed and the transmission signal, distortion to the signal that is input to the first amplifier or the noise component that is input to the second amplifier.

7 Claims, 8 Drawing Sheets

(56) References Cited

U.S. PATENT DOCUMENTS

| | | | |
|---|---|---|---|
| 2004/0037369 A1* | 2/2004 | Matsuura | H04L 27/18 375/302 |
| 2004/0038648 A1* | 2/2004 | Matsuura | H04B 14/06 455/101 |
| 2005/0017802 A1 | 1/2005 | Robinson | |
| 2012/0242521 A1* | 9/2012 | Kinyua | H03M 7/3022 341/143 |
| 2015/0009058 A1* | 1/2015 | Nentwig | H03M 3/50 341/144 |

OTHER PUBLICATIONS

Sangil Park, Ph.D., Motorola Digital Signal Processors, "Principles of Sigma-Delta Modulation for Analog-to-Digital Converters", APR8/D Rev. 1 (71 pages).

Toru Matsuura, et al., "A High Efficiency Transmitter with a Delta-Sigma Modulator and a Noise Cancellation Circuit", European Conference on Wireless Technology 2004, Amsterdam, pp. 57-60 (4 pages).

Hsin-Hung Chen, et al., "Joint Polynomial and Look-Up-Table Predistortion Power Amplifier Linearization", vol. 53, No. 8, Aug. 2006, pp. 612-616 (5 pages).

* cited by examiner

RELATED ART

TRANSMISSION DEVICE AND NOISE REMOVAL METHOD

CROSS-REFERENCE TO RELATED APPLICATION

This application is based upon and claims the benefit of priority of the prior Japanese Patent Application No. 2015-076112, filed on Apr. 2, 2015, the entire contents of which are incorporated herein by reference.

FIELD

The embodiment discussed herein is related to a transmission device and a noise removal method.

BACKGROUND

In general, in amplifiers, such as high power amplifiers (HPAs), provided in, for example, transmission devices, when output electrical power approaches a saturation region due to an increase in input electrical power, the linearity of the input electrical power and the output electrical power is lost. Consequently, when an amplifier is operated in the vicinity of the saturation region in which the efficiency of the electrical power is high, nonlinear distortion is generated. Because the nonlinear distortion causes out-of-band radiation or the like, in order to suppress the nonlinear distortion, it is conceivable to use a method of converting a signal amplified by an amplifier, thereby obtaining the constant amplitude.

Specifically, studies have been conducted on a method in which a transmission signal that is to be amplified by the amplifier is converted to a signal with the constant amplitude by performing, for example, $\Sigma\Delta$ modulation and the converted signal is amplified by the amplifier and then transmitted. With the $\Sigma\Delta$ modulation, because a signal with a multi-bit quantization bit rate is converted to a signal with a 1-bit quantization bit rate, the transmission signal in which the amplitude varies can be converted to a transmission signal in which the amplitude is constant. Furthermore, because the amplitude of the transmission signal becomes constant, the electrical power that is input to the amplifier becomes constant and thus the occurrence of nonlinear distortion can be suppressed.

However, when a signal is subjected to the $\Sigma\Delta$ modulation, quantization noise with a relatively high level is generated outside the frequency band of the signal. Accordingly, in order to remove the quantization noise, a band-pass filter with a high Q value is sometimes provided downstream of the amplifier. Furthermore, if the band-pass filter with the high Q value is provided, the size and the cost of transmission devices are increased. Accordingly, a study has been conducted on a method, in which, in addition to a path for amplifying a transmission signal, a path for amplifying a noise component is provided in a transmission device and a noise component is removed from the amplified transmission signal.

Figure 8:
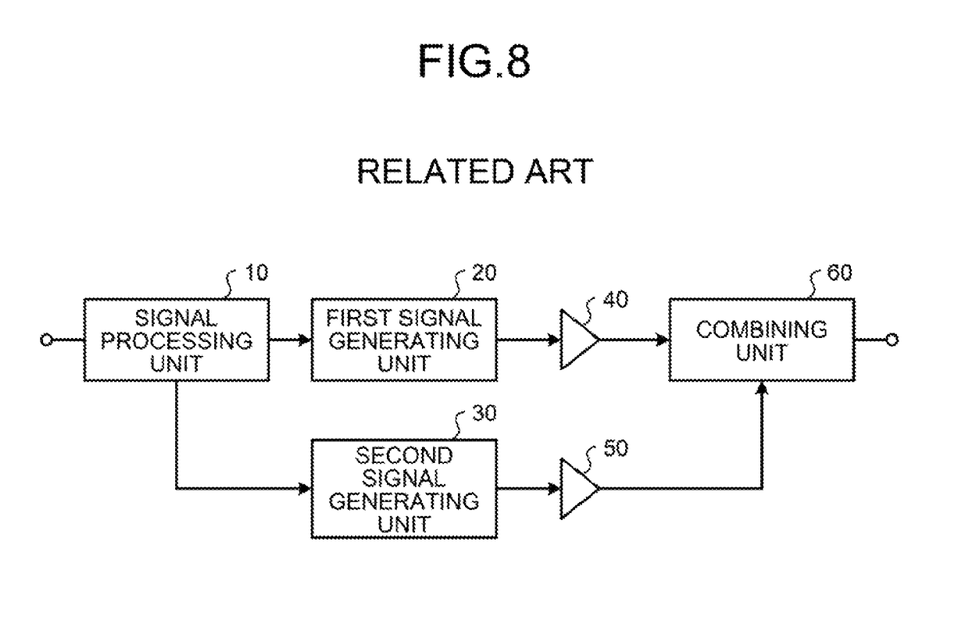
FIG. 8 is a block diagram illustrating an example of a transmission circuit.

FIG. 8 is a block diagram illustrating an example of a transmission circuit. The transmission circuit illustrated in FIG. 8 includes a signal processing unit 10, a first signal generating unit 20, a second signal generating unit 30, amplifiers 40 and 50, and a combining unit 60.

In the transmission circuit illustrated in FIG. 8, when a transmission signal subjected to signal processing by the signal processing unit 10 is input to the first signal generating unit 20 and the second signal generating unit 30, the first signal generating unit 20 performs, for example, $\Sigma\Delta$ modulation on the transmission signal. At this time, a noise component generated due to the $\Sigma\Delta$ modulation is added to the transmission signal. Furthermore, the second signal generating unit 30 generates the same noise component as that generated due to the $\Sigma\Delta$ modulation performed by the first signal generating unit 20. Then, transmission signal that has been subjected to the $\Sigma\Delta$ modulation by the first signal generating unit 20 is amplified by the amplifier 40, whereas the noise component generated in the second signal generating unit 30 is amplified by the amplifier 50. The amplified transmission signal and the amplified noise component are combined by the combining unit 60. At this time, by inverting the phase of the noise component amplified by the amplifier 50 and by combining the noise component with the transmission signal, the noise component is removed from the transmission signal.

[Patent document 1] Japanese Laid-open Patent Publication No. 2004-72735.

[Patent document 2] Japanese Laid-open Patent Publication No. 2005-295521.

[Non-Patent Document 1] Antoine Frappe et al. "An All-Digital RF Signal Generator Using High-Speed $\Sigma\Delta$ Modulators" IEEE JOURNAL OF SOLID-STATE CIRCUITS, Vol. 44, No. 10, October, 2009.

[Non-Patent Document 2] Toru Matsuura et al. "A High Efficiency Transmitter with a Delta-Sigma Modulator and a Noise Cancellation Circuit" European Conference on Wireless Technology, 2004.

[Non-Patent Document 3] Hsin-Hung Chen et al. "Joint Polynomial and Look-Up-Table Predistortion Power Amplifier Linearization" IEEE TRANSACTIONS ON CIRCUITS AND SYSTEMS-II: EXPRESS BRIEFS, Vol. 53, No. 8, August 2006.

However, with the technology that removes the noise component by amplifying the transmission signal and the noise component using different paths and by combining the transmission signal with the noise component, there is a problem in that, when the characteristics of both paths are unbalanced, it is difficult to sufficiently remove the noise component. Specifically, for example, in the transmission circuit illustrated in FIG. 8, when the amplifiers 40 and 50 have different linear characteristics or gains, the transmission signal and the noise component are not amplified under the same condition and, even when the amplified transmission signal and the amplified noise component are combined, the noise component is not sufficiently removed. Accordingly, the characteristics of the paths used for amplifying the transmission signal and the noise component are preferably be matched; however, because there are individual differences in components, such as amplifiers, provided in both the paths, it is not practical to completely match the characteristics of both the paths.

SUMMARY

According to an aspect of an embodiment, a transmission device includes a converting unit that converts a transmission signal with a multi-bit quantization bit rate to a signal with a quantization bit rate smaller than the quantization bit rate of the transmission signal; a first amplifier that amplifies the signal converted by the converting unit; an extracting unit that extracts a noise component generated in the signal due to the conversion performed by the converting unit; a second amplifier that amplifies the noise component extracted by the extracting unit; a combining unit that combines the signal amplified by the first amplifier with the noise component amplified by the second amplifier to remove a noise component included in the amplified signal; and an adding unit that adds, based on an error between the signal from which the noise component has been removed by the combining unit and the transmission signal with the multi-bit quantization bit rate, distortion to the signal that is input to the first amplifier or the noise component that is input to the second amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Note that the present invention is not limited by the embodiments described herein.

[a] First Embodiment

Figure 1:
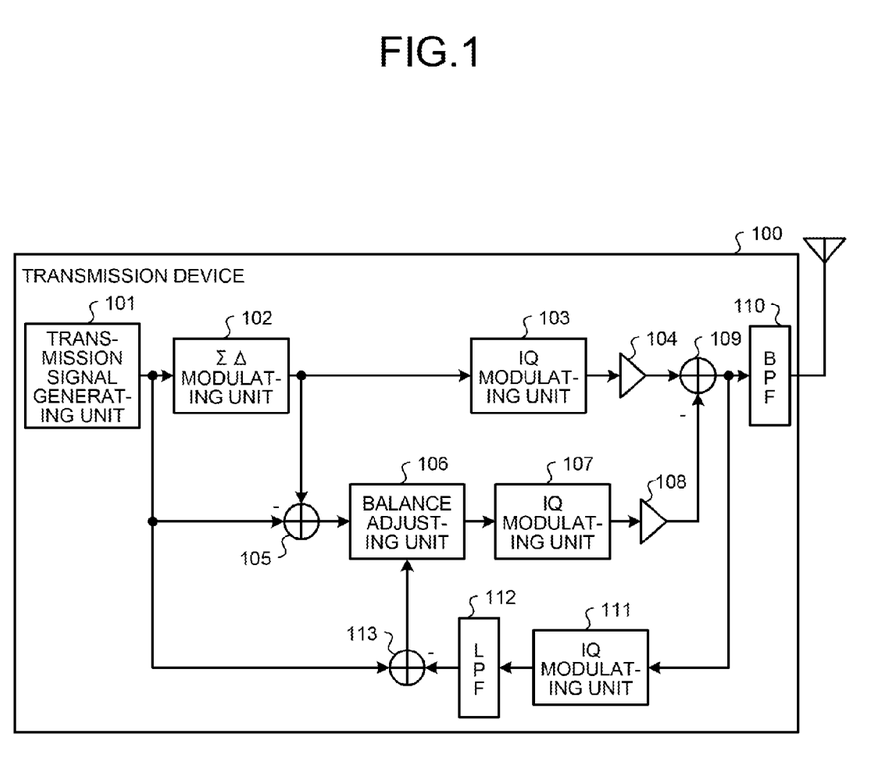
FIG. 1 is a block diagram illustrating the configuration of a transmission device according to a first embodiment.

FIG. 1 is a block diagram illustrating the configuration of a transmission device according to a first embodiment. A transmission device 100 illustrated in FIG. 1 includes a transmission signal generating unit 101, a $\Sigma\Delta$ modulating unit 102, an in-phase quadrature (IQ) modulating unit 103, an amplifier 104, a noise component extracting unit 105, a balance adjusting unit 106, an IQ modulating unit 107, an amplifier 108, a combining unit 109, and a band-pass filter (hereinafter, referred to as a "BPF") 110. Among these units, the $\Sigma\Delta$ modulating unit 102, the IQ modulating unit 103, and the amplifier 104 constitute a path for a transmission signal. In contrast, the noise component extracting unit 105, the balance adjusting unit 106, the IQ modulating unit 107, and the amplifier 108 constitute a path for a noise component. Furthermore, the transmission device 100 includes, as a feedback system, an IQ demodulating unit 111, a low-pass filter (hereinafter, referred to as an "LPF") 112, and an error calculating unit 113.

The transmission signal generating unit 101 performs encoding, modulation, or the like on data and generates a transmission signal. The transmission signal generated by the transmission signal generating unit 101 is a base band signal with a multi-bit quantization bit rate.

The $\Sigma\Delta$ modulating unit 102 performs $\Sigma\Delta$ modulation on the transmission signal with the multi-bit quantization bit rate and generates a transmission signal with a 1-bit quantization bit rate. Specifically, the $\Sigma\Delta$ modulating unit 102 converts the transmission signal to a transmission signal with the constant amplitude. At this time, quantization noise is generated due to the $\Sigma\Delta$ modulation performed by the $\Sigma\Delta$ modulating unit 102 and thus a noise component is included in the transmission signal.

The IQ modulating unit 103 performs quadrature modulation on the transmission signal; performs digital/analogue (D/A) conversion to superimpose the transmission signal onto a carrier; and obtains a transmission signal with a radio frequency.

The amplifier 104 amplifies the transmission signal with the radio frequency at a predetermined gain. At this point, in the first embodiment, because the transmission signal is subjected to the $\Sigma\Delta$ modulation and the amplitude is constant, the generation of nonlinear distortion in the amplifier 104 can be suppressed.

The noise component extracting unit 105 subtracts the transmission signal that has not been subjected to the $\Sigma\Delta$ modulation from the transmission signal that has been subjected to the $\Sigma\Delta$ modulation, whereby the noise component extracting unit 105 extracts the noise component generated due to the $\Sigma\Delta$ modulation.

The balance adjusting unit 106 adds, to the noise component on the basis of an error between the transmission signal and a feedback signal calculated by the error calculating unit 113, distortion that is used to adjust the balance between the path for the transmission signal and the path for the noise component. Specifically, in the first embodiment, the path for the transmission signal and the path for the noise component are separately arranged and different IQ modulating units 103 and 107 and the amplifiers 104 and 108 are included in the paths, respectively. Consequently, for example, due to the difference of the linear characteristics between the amplifier 104 and the amplifier 108, the characteristic of the path for the transmission signal is not completely matched to that for the noise component, and thus, both the paths are unbalanced. Accordingly, in order to adjust the balance between the paths, the balance adjusting unit 106 previously distorts the noise component on the basis of the error between the transmission signal and the feedback signal.

Specifically, the balance adjusting unit 106 adds distortion to the noise component by using, for example, a memory polynomial equation. For the memory polynomial equation, for example, Equation (1) below may be used.

$$S_{out}(n) = \sum_{k=1}^{K} \sum_{q=0}^{Q} a_{kq} \cdot S_{in}(n-q) \cdot |S_{in}(n-q)|^{k-1} \quad (1)$$

In Equation (1), $S_{in}(n)$ and $S_{out}(n)$ represents an input signal and an output signal, respectively, of the balance adjusting unit 106 at time n. Furthermore, $a_{kq}$ is a coefficient according to an error calculated by the error calculating unit 113. The coefficient $a_{kq}(n)$ at time n can be calculated by Equation (2) below by using, for example, the coefficient $a_{kq}(n-1)$ obtained at immediately previous time (n−1).

$$a_{kq}(n) = a_{kq}(n-1) + \mu \cdot \epsilon(n-1) \cdot S_{fed}^{*} \quad (2)$$

In Equation (2), $\mu$ represents a constant and $\epsilon(n-1)$ represents an output from the error calculating unit 113 at time (n−1). Furthermore, $S_{fed}^*$ represents a complex conjugate of a feedback signal that is fed back from the combining unit 109.

The balance adjusting unit 106 adds distortion to a noise component by using Equation (1), thereby converging the error ϵ between the transmission signal and the feedback signal to 0.

The IQ modulating unit 107 performs quadrature modulation on the noise component to which the distortion is added; performs D/A conversion to superimpose the noise component onto a carrier; and obtains a noise component with the radio frequency.

The amplifier 108 amplifies the noise component with the radio frequency at the same gain as that of the amplifier 104. The gain of the amplifier 108 is preferably the same as that of the amplifier 104; however, it is difficult to completely match both the gains. However, in the first embodiment, because distortion is previously added to the noise component by the balance adjusting unit 106, the error of the gain between the amplifier 104 and the amplifier 108 is compensated by this distortion.

The combining unit 109 combines the transmission signal amplified by the amplifier 104 with the noise component amplified by the amplifier 108. Specifically, the combining unit 109 inverts the phase of the noise component amplified by the amplifier 108 and then combines the noise component with the transmission signal. Thus, the combining unit 109 removes the noise component included in the transmission signal.

The BPF 110 removes unwanted bandwidth of the transmission signal, in which a noise component has been removed by the combining unit 109, and then wirelessly transmits the obtained transmission signal from the antenna.

The IQ demodulating unit 111 feeds back the transmission signal that has been output from the combining unit 109; performs analogue/digital (A/D) conversion on the feedback signal; and performs quadrature demodulation.

The LPF 112 removes unwanted image frequency band or the like that is included in the feedback signal output from the IQ demodulating unit 111.

The error calculating unit 113 calculates an error between the transmission signal generated by the transmission signal generating unit 101 and the feedback signal and then outputs the calculated error to the balance adjusting unit 106.

Figure 2:
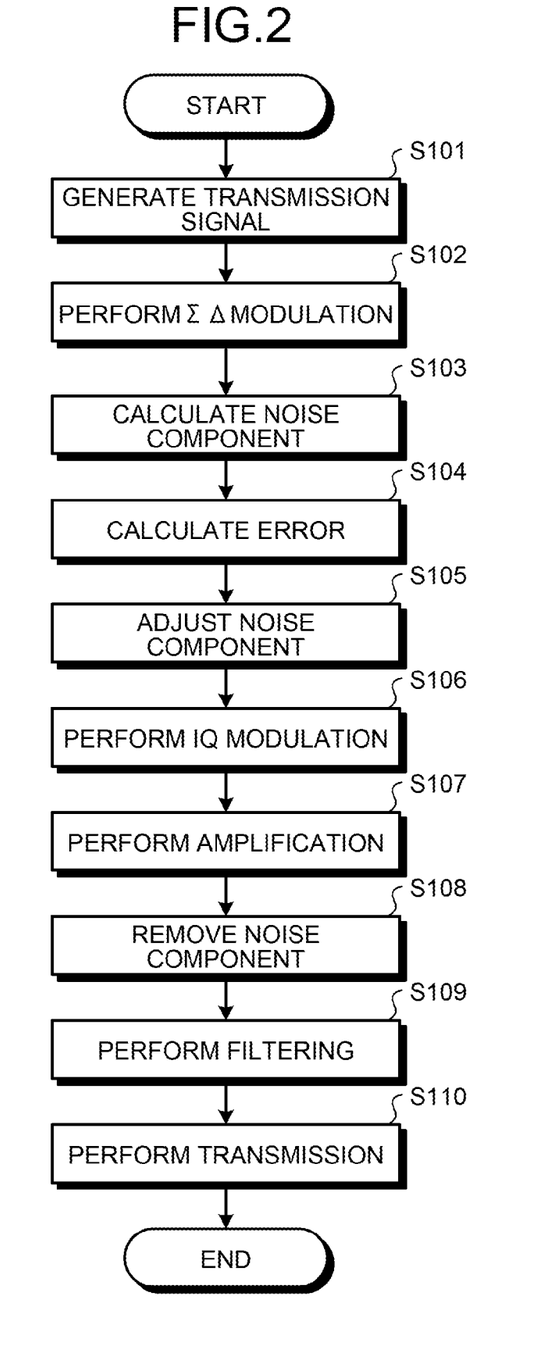
FIG. 2 is a flowchart illustrating a noise removal process according to the first embodiment.

In the following, a noise removal process performed in the transmission device 100 having the configuration described above will be described with reference to the flowchart illustrated in FIG. 2.

First, encoding, modulation, or the like is performed on data by the transmission signal generating unit 101 and a transmission signal with a multi-bit quantization bit rate is generated (Step S101). The transmission signal is subjected to the ΣΔ modulation by the ΣΔ modulating unit 102 (Step S102) and a transmission signal with a 1-bit quantization bit rate is generated. At this point, because quantization noise due to the ΣΔ modulation is generated, the transmission signal with the 1-bit quantization bit rate generated by the ΣΔ modulating unit 102 includes a noise component. Accordingly, the noise component extracting unit 105 performs subtraction on the transmission signals obtained before and after the ΣΔ modulation and then calculates a noise component included in the transmission signal that has been subjected to the ΣΔ modulation (Step S103).

In contrast, the transmission signal that has not been subjected to the ΣΔ modulation is also input to the error calculating unit 113 and an error between this transmission signal and the feedback signal is calculated (Step S104). The calculated error is output to the balance adjusting unit 106. Then, distortion is added to the noise component by the balance adjusting unit 106 such that the error between the transmission signal and the feedback signal approaches zero (Step S105). Specifically, by using the memory polynomial equation indicated by Equation (1) above in which the coefficient associated with the error between the transmission signal and the feedback signal is used, distortion is previously added to the noise component. This distortion is the distortion that compensates the unbalance of the characteristics between the path for the transmission signal and the path for the noise component. In other words, by previously adding distortion to the noise component, the balance between the path for the transmission signal and the path for the noise component is adjusted.

Then, the noise component to which the distortion is added is subjected to quadrature modulation and D/A conversion by the IQ modulating unit 107. Similarly, the transmission signal is subjected to quadrature modulation and D/A conversion by the IQ modulating unit 103 (Step S106). The transmission signal and the noise component that become analog signals by the IQ modulating units 103 and 107 are amplified by the amplifiers 104 and 108, respectively (Step S107). At this time, because the same gain is set in the amplifier 104 and the amplifier 108, the transmission signal and the noise component are amplified at the same gain.

Then, the noise component with the inverted phase is combined with the transmission signal by the combining unit 109, whereby the noise component included in the transmission signal is removed (Step S108). Here, the distortion is previously added to the noise component by the balance adjusting unit 106 and the unbalance of the characteristics between the path for the transmission signal and the path for the noise component is compensated. Consequently, when the transmission signal and the noise component pass through the paths that have different characteristics, the noise component included in the transmission signal is sufficiently removed by the combining unit 109.

The transmission signal from which the noise component has been removed is fed back to the IQ demodulating unit 111; is used for calculating an error by the error calculating unit 113; and is subjected to perform filtering by the BPF 110 (Step S109). Specifically, unwanted bandwidth of the transmission signal is removed by the BPF 110. Then, the transmission signal that has been subjected to the filtering by the BPF 110 is wirelessly transmitted via the antenna (Step S110).

As described above, in the first embodiment, distortion is previously added to a noise component by the balance adjusting unit 106 such that an error between a transmission signal that has not been subjected to the ΣΔ modulation and a transmission signal from which the noise component has been removed is reduced. Consequently, the unbalance between the path for the transmission signal and the path for the noise component due to, for example, the difference of the linear characteristic or the gain between the amplifiers 104 and 108 is compensated. As a result, when the amplitude of the transmission signal is converted by the ΣΔ modulation, by combining the transmission signal with the noise component by the combining unit 109, noise can be sufficiently removed from the transmission signal.

Figure 3:
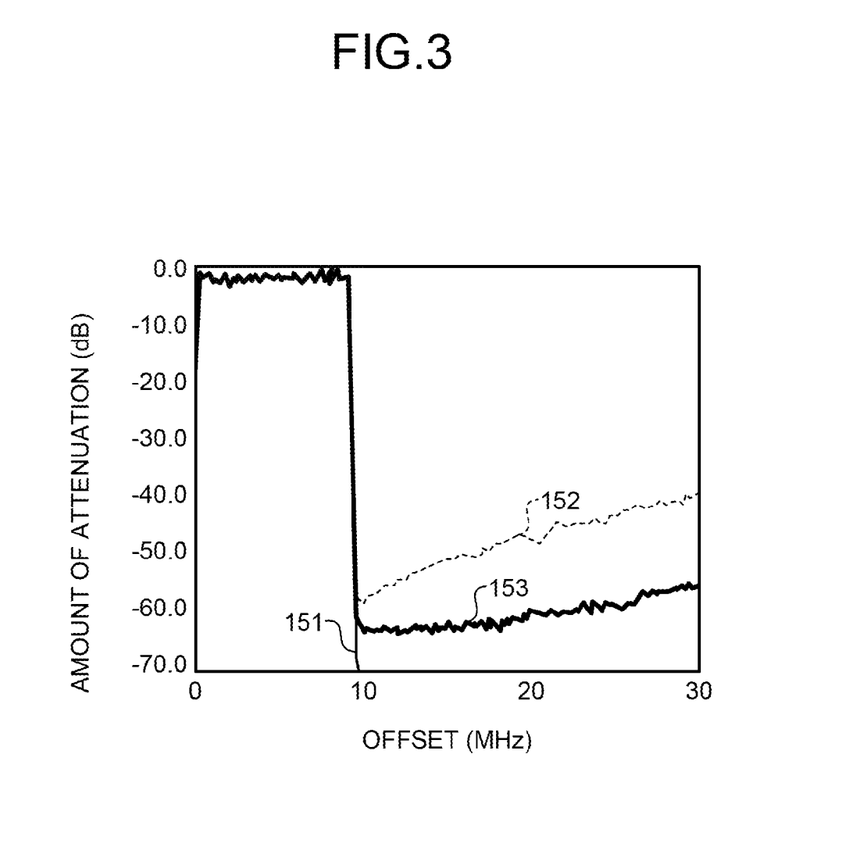
FIG. 3 is a schematic diagram illustrating a specific example of the power spectral density of signals.

FIG. 3 is a diagram illustrating the power spectral density in a case in which a transmission signal is an orthogonal frequency division multiplexing (OFDM) signal with the bandwidth of 20 MHz and the peak-to-average power ratio (PAPR) of 7 dB. In FIG. 3, the horizontal axis indicates an offset from the center frequency and the vertical axis indicates an amount of attenuation. Furthermore, a graph 151 indicates the power spectral density of the original transmission signal that has not been subjected to the ΣΔ modulation, a graph 152 indicates the power spectral density of the transmission signal that has been subjected to the ΣΔ modulation, and a graph 153 indicates the power spectral density of the transmission signal that is output from the combining unit 109.

Because the bandwidth of the transmission signal that has not been subjected to the ΣΔ modulation is 20 MHz, as indicated by the graph 151 illustrated in FIG. 3, the power is very small in the bandwidth in which the offset from the center frequency is equal to or greater than 10 MHz. In contrast, for the transmission signal that has been subjected to the ΣΔ modulation, as indicated by the graph 152 illustrated in FIG. 3, the power is increased even in the bandwidth in which the offset from the center frequency is equal to or greater than 10 MHz. This means that the level of the out-of-band radiation is increased due to the noise component generated due to the ΣΔ modulation. However, as in the embodiment, because distortion is previously added to the noise component by the balance adjusting unit 106 and then the noise component is combined with the transmission signal, the noise component in the transmission signal is removed and, as indicated by the graph 153 illustrated in FIG. 3, the level of the out-of-band radiation is reduced.

As described above, according to the first embodiment, the transmission signal that has been subjected to the ΣΔ modulation and the noise component are amplified by using different paths and, when the noise component is removed from the transmission signal, distortion that reduces an error between the transmission signal that has not been subjected to the ΣΔ modulation and the transmission signal from which the noise component has been removed is previously added to the noise component. Consequently, it is possible to compensate the unbalance of the characteristics between the path for the transmission signal and the path for the noise component and adjust the balance of both the paths. As a result, when the amplitude of the transmission signal is converted by ΣΔ modulation, noise can also be sufficiently removed from the transmission signal.

Figure 4:
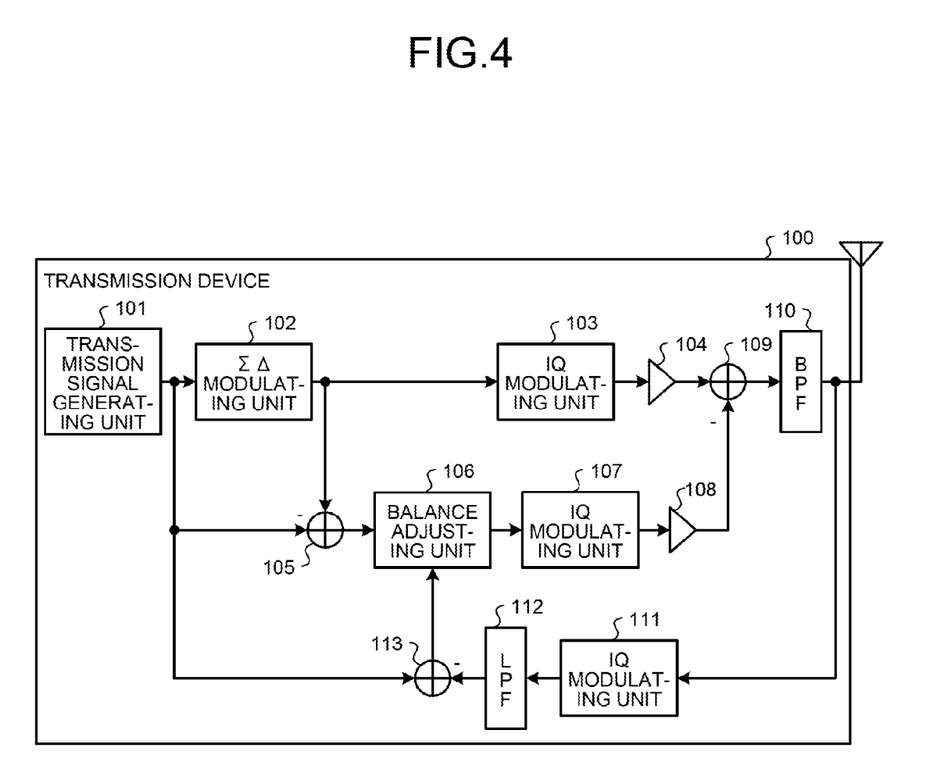
FIG. 4 is a block diagram illustrating a modification of the transmission device according to the first embodiment.

Furthermore, in the first embodiment, the noise component is removed by the combining unit 109 and the transmission signal that has not been input to the BPF 110 is fed back; however, as illustrated in FIG. 4, it is possible to feed back the transmission signal that is output from the BPF 110. By doing so, distortion that reduces an error between the transmission signal that has not been subjected to the ΣΔ modulation and the transmission signal that is actually transmitted from the antenna is added to the noise component by the balance adjusting unit 106.

[b] Second Embodiment

The feature of a second embodiment is that, by enhancing the linearization of the characteristic of the path for the noise component, the balance between the path for the transmission signal and the path for the noise component is adjusted.

Figure 5:
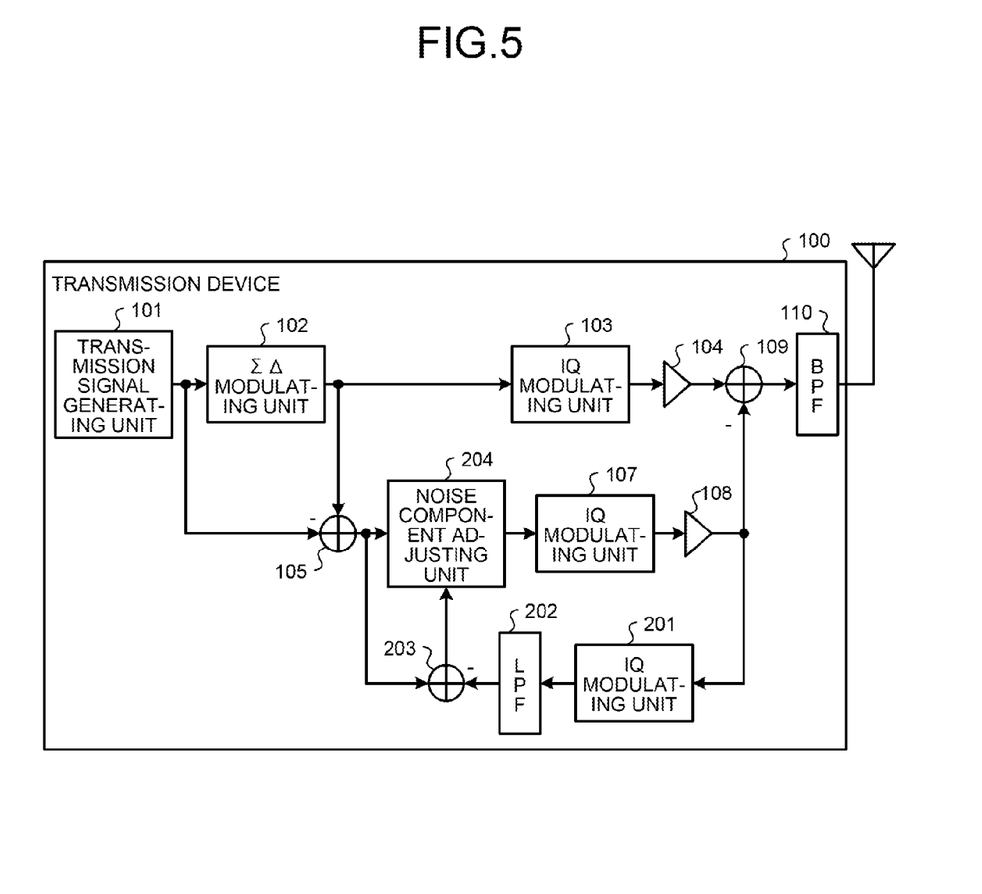
FIG. 5 is a block diagram illustrating the configuration of a transmission device according to a second embodiment.

FIG. 5 is a block diagram illustrating the configuration of the transmission device 100 according to a second embodiment. In FIG. 5, components having the same configuration as those illustrated in FIG. 1 are assigned the same reference numerals and descriptions thereof will be omitted. The transmission device 100 illustrated in FIG. 5 includes, instead of the IQ demodulating unit 111, the LPF 112, and the error calculating unit 113 illustrated in FIG. 1, an IQ demodulating unit 201, an LPF 202, and an error calculating unit 203. Furthermore, the transmission device 100 illustrated in FIG. 5 includes, instead of the balance adjusting unit 106 illustrated in FIG. 1, a noise component adjusting unit 204.

The IQ demodulating unit 201 feeds back the noise component amplified by the amplifier 108; performs A/D conversion on the feedback signal; and performs quadrature demodulation.

The LPF 202 removes unwanted image frequency band or the like included in the feedback signal that is output from the IQ demodulating unit 201.

The error calculating unit 203 calculates an error between the noise component extracted by the noise component extracting unit 105 and the feedback signal and then outputs the calculated error to the noise component adjusting unit 204.

The noise component adjusting unit 204 adds, to the noise component on the basis of the error between the noise component calculated by the error calculating unit 203 and the feedback signal, distortion that is used to linearize the characteristic of the path for the noise component. Specifically, the noise component adjusting unit 204 previously adds, to the noise component, distortion that compensates, for example, nonlinear distortion generated in the amplifier 108. The noise component adjusting unit 204 adds distortion to the noise component by using, for example, the memory polynomial equation that has a coefficient associated with an error calculated by the error calculating unit 203.

In the second embodiment, by feeding back the noise component amplified by the amplifier 108, the path for the noise component is linearized. In general, because the amplitude of a noise component extracted by the noise component extracting unit 105 is not constant, nonlinear distortion is generated when the noise component is amplified by the amplifier 108. In contrast, because the amplitude of a transmission signal is constant due to ΣΔ modulation performed by the ΣΔ modulating unit 102, nonlinear distortion is not generated when the transmission signal is amplified by the amplifier 104. Accordingly, in the second embodiment, by previously adding distortion to the noise component, nonlinear distortion generated in the amplifier 108 is compensated. Therefore, it is possible to regard both the amplifier 104 and the amplifier 108 as linear amplifiers and thus it is possible to adjust the balance between the path for the transmission signal and the path for the noise component. Consequently, when the amplitude of the transmission signal is converted due to the ΣΔ modulation, the transmission signal is combined with the noise component by the combining unit 109, whereby noise can be sufficiently removed from the transmission signal.

As described above, according to the second embodiment, when a transmission signal subjected to the ΣΔ modulation and a noise component are amplified by using different paths and the noise component is removed from the transmission signal, distortion that reduces an error between the noise components generated before and after the amplification performed by an amplifier is previously added to the noise component that has not been amplified. Consequently, it can be assumed that the nonlinear distortion generated in the amplifier that amplifies the noise component is compensated and both of the amplifiers arranged on the paths perform linear amplification on the transmission signal and the noise component. As a result, when the amplitude of the transmission signal is converted due to the ΣΔ modulation, noise can be sufficiently removed from the transmission signal.

[c] Third Embodiment

The feature of a third embodiment is that, by previously adding distortion to a transmission signal, the balance between a path for a transmission signal and a path for a noise component is adjusted.

Figure 6:
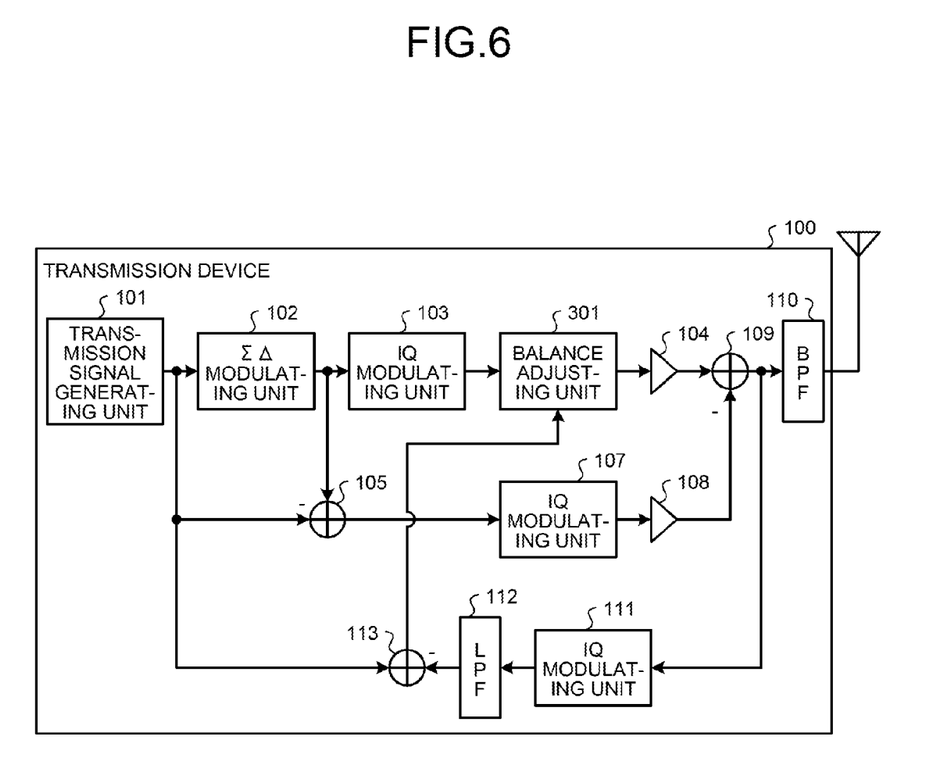
FIG. 6 is a block diagram illustrating the configuration of a transmission device according to a third embodiment.

FIG. 6 is a block diagram illustrating the configuration of the transmission device 100 according to the third embodiment. In FIG. 6, components having the same configuration as those illustrated in FIG. 1 are assigned the same reference numerals and descriptions thereof will be omitted. The transmission device 100 illustrated in FIG. 6 includes, instead of the balance adjusting unit 106 illustrated in FIG. 1, a balance adjusting unit 301.

The balance adjusting unit 301 adds, to the transmission signal on the basis of the error between the transmission signal and the feedback signal calculated by the error calculating unit 113, distortion that is used to adjust the balance between the path for the transmission signal and the path for the noise component. Specifically, unlike the balance adjusting unit 106 that adds distortion to the noise component, the balance adjusting unit 301 previously distorts the transmission signal on the basis of the error between the transmission signal and the feedback signal.

Here, because of the transmission signal is a signal with the constant amplitude due to the ΣΔ modulation performed by the ΣΔ modulating unit 102, it is difficult to add distortion in a state of digital signal. Accordingly, the balance adjusting unit 301 adds distortion to the transmission signal that has been converted to an analog signal by the IQ modulating unit 103.

Figure 7:
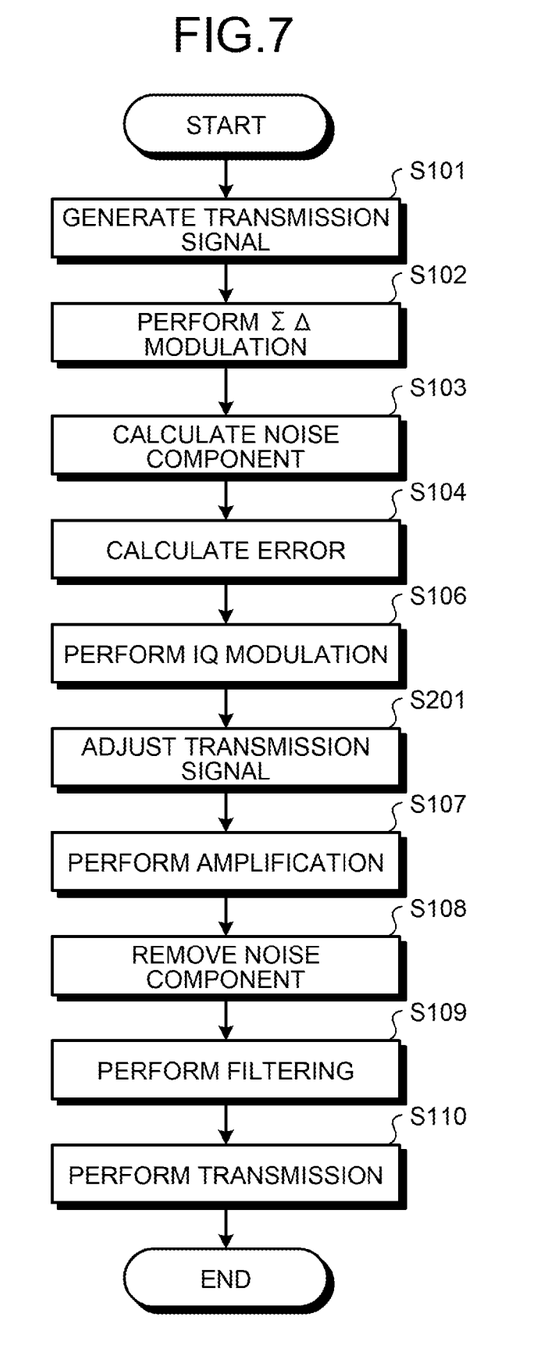
FIG. 7 is a flowchart illustrating a noise removal process according to the third embodiment.

In the following, a noise removal process performed in the transmission device 100 having the configuration described above will be described with reference to the flowchart illustrated in FIG. 7. In FIG. 7, components having the same configuration as those illustrated in FIG. 2 are assigned the same reference numerals and descriptions thereof in detail will be omitted.

The transmission signal with a multi-bit quantization bit rate generated by the transmission signal generating unit 101 is subjected to the ΣΔ modulation by the ΣΔ modulating unit 102 and becomes a transmission signal with a 1-bit quantization bit rate (Step S101, S102). Then, the noise component extracting unit 105 performs subtraction on the transmission signals obtained before and after the ΣΔ modulation and then calculates a noise component included in the transmission signal that has been subjected to the ΣΔ modulation (Step S103).

In contrast, the transmission signal that has not been subjected to the ΣΔ modulation is also input to the error calculating unit 113 and an error between this transmission signal and the feedback signal is calculated (Step S104). The calculated error is output to the balance adjusting unit 301. Furthermore, the transmission signal and the noise component are subjected to quadrature modulation and D/A conversion by the IQ modulating units 103 and 107, respectively (Step S106). Then, distortion is added, by the balance adjusting unit 301, to the transmission signal that has been converted to the analog signal such that the error output from the error calculating unit 113 approaches zero (Step S201). Specifically, by using the memory polynomial equation indicated by Equation (1) above in which the coefficient associated with the error between the transmission signal and the feedback signal, distortion is previously added to the analog transmission signal. This distortion is the distortion that compensates unbalance of the characteristics between the path for the transmission signal and the path for the noise component. In other words, by previously adding distortion to the transmission signal, the balance of the characteristics between the path for the transmission signal and the path for the noise component is adjusted.

Both the transmission signal to which the distortion is added and the noise component are amplified by the amplifiers 104 and 108, respectively (Step S107). Then, the noise component with the inverted phase is combined with the transmission signal by the combining unit 109, whereby the noise component included in the transmission signal is removed (Step S108). Here, the distortion is previously added to the transmission signal by the balance adjusting unit 301 and the unbalance of the characteristics between the path for the transmission signal and the path for the noise component is compensated. Consequently, when the transmission signal and the noise component pass through paths that have different characteristics, the noise component included in the transmission signal is sufficiently removed by the combining unit 109.

The transmission signal from which the noise component has been removed is fed back to the IQ demodulating unit 111; is used for calculating an error by the error calculating unit 113; and is subjected to filtering by the BPF 110 (Step S109). Then, the transmission signal that has been subjected to the filtering by the BPF 110 is wirelessly transmitted via the antenna (Step S110).

As described above, according to the third embodiment, the transmission signal subjected to the ΣΔ modulation and the noise component are amplified by using different paths and, when the noise component is removed from the transmission signal, distortion that reduces an error between the transmission signal that has not been subjected to the ΣΔ modulation and the transmission signal from which the noise component has been removed is previously added to the transmission signal. Consequently, it is possible to compensate the unbalance of the characteristics between the path for the transmission signal and the path for the noise component and adjust the balance between both the paths. As a result, when the amplitude of the transmission signal is converted due to the ΣΔ modulation, noise can be sufficiently removed from the transmission signal.

Furthermore, in the third embodiment, distortion is added to the transmission signal that has been converted to the analog signal by the IQ modulating unit 103; however, for example, it is possible to adjust the balance between the path for the transmission signal and the path for the noise component by adding distortion to the transmission signal that has not been subjected to the ΣΔ modulation. Specifically, by making the amplitude constant due to the ΣΔ modulation, the occurrence of nonlinear distortion is suppressed. Thus, even though it is difficult to add the distortion to the transmission signal subjected to the ΣΔ modulation, the distortion can be added to the transmission signal that has not been subjected to the ΣΔ modulation or the transmission signal that has been converted to the analog signal.

Furthermore, in each of the embodiments described above, conversion in which the amplitude of the transmission signal is made constant due to the ΣΔ modulation is performed; however, even if conversion other than the ΣΔ modulation is performed on the transmission signal, similarly to the embodiments described above, the noise component of the transmission signal can also be removed. Specifically, if a transmission signal with an m-bit quantization bit rate (m is an integer equal to or greater than 2) is converted to a transmission signal with an n-bit quantization bit rate (n is an integer less than m), a noise component is generated due to a decrease in the quantization bit rate; however, similar to the embodiments described above, the noise component can also be removed in a similar manner.

Furthermore, in each of the embodiments described above, distortion is added to the transmission signal or the noise component by using the memory polynomial equation; however, the distortion may also be determined without using the memory polynomial equation. Specifically, for example, a look-up table that stores therein distortion associated with errors may also be referred to and then the distortion that is associated with the calculated error may also be added to the transmission signal or the noise component.

The processes performed by the transmission signal generating unit 101, the ΣΔ modulating unit 102, the noise component extracting unit 105, the balance adjusting unit 106, the noise component adjusting unit 204, and the error calculating units 113 and 203 described in each of the embodiments may also be performed by, for example, a processor, such as a central processing unit (CPU), a digital signal processor (DSP), or the like, included in the transmission device 100. In this case, the processor executes various kinds of arithmetic processing while storing data to be used or the like in a memory.

According to an aspect of an embodiment of the transmission device and the noise removal method disclosed in the present invention, an advantage is provided in that, when the amplitude of a transmission signal is converted, noise can be sufficiently removed from the transmission signal.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission device comprising:
   a converting unit that converts a transmission signal with a multi-bit quantization bit rate to a signal with a quantization bit rate smaller than the quantization bit rate of the transmission signal;
   a first amplifier that amplifies the signal converted by the converting unit;
   an extracting unit that extracts a noise component generated in the signal converted by the converting unit due to the conversion performed by the converting unit;
   a second amplifier that amplifies the noise component extracted by the extracting unit;
   a combining unit that combines the signal amplified by the first amplifier with the noise component amplified by the second amplifier to remove a noise component included in the signal amplified by the first amplifier; and
   an adding unit that adds, based on an error between a signal from which the noise component has been removed by the combining unit and the transmission signal with the multi-bit quantization bit rate, distortion to the signal converted by the converting unit that is input to the first amplifier or the noise component that is input to the second amplifier.

2. The transmission device according to claim 1, wherein the adding unit adds the distortion that reduces the error between the signal from which the noise component has been removed and the transmission signal with the multi-bit quantization bit rate.

3. The transmission device according to claim 1, wherein the converting unit performs ΣΔ modulation on the transmission signal with the multi-bit quantization bit rate to convert the transmission signal to a signal with a 1-bit quantization bit rate.

4. The transmission device according to claim 1, wherein the adding unit adds the distortion to an analog signal that is obtained by performing digital/analogue (D/A) conversion on the signal converted by the converting unit.

5. The transmission device according to claim 1, wherein the adding unit adds the distortion calculated by using a polynomial equation that includes a coefficient associated with the error between the signal from which the noise component has been removed and the transmission signal with the multi-bit quantization bit rate.

6. A transmission device comprising:
   a converting unit that converts a transmission signal with a multi-bit quantization bit rate to a signal with a quantization bit rate smaller than the quantization bit rate of the transmission signal;
   a first amplifier that amplifies the signal converted by the converting unit;
   an extracting unit that extracts a noise component generated in the signal converted by the converting unit due to the conversion performed by the converting unit;
   a second amplifier that amplifies the noise component extracted by the extracting unit;
   a combining unit that combines the signal amplified by the first amplifier with the noise component amplified by the second amplifier to remove a noise component included in the signal amplified by the first amplifier; and
   an adding unit that adds, based on an error between the noise component extracted by the extracting unit and the noise component amplified by the second amplifier, distortion to the noise component that is input to the second amplifier.

7. A noise removal method comprising:
   converting a transmission signal with a multi-bit quantization bit rate to a signal with a quantization bit rate smaller than the quantization bit rate of the transmission signal;
   extracting a noise component generated in the converted signal due to the conversion;
   adding, based on an error between a feedback signal that is fed back after the noise component has been removed from the signal and the transmission signal with the multi-bit quantization bit rate, distortion to the converted signal or the noise component;
   amplifying the converted signal and the noise component by using different amplifiers; and
   combining the amplified converted signal and the amplified noise component.

\* \* \* \* \*